United States Patent

Murai et al.

[11] Patent Number: 5,917,266
[45] Date of Patent: Jun. 29, 1999

[54] CONTROL APPARATUS FOR INTERMITTENTLY DRIVING ACTUATOR, POWDER FEEDER AND SERVO SYSTEM UTILIZING THEREOF

[75] Inventors: Katsumi Murai; Mamoru Tateishi, both of Obu, Japan

[73] Assignee: Aisan Kogyo Kabushiki Kaisha, Japan

[21] Appl. No.: 08/933,010

[22] Filed: Sep. 18, 1997

[30] Foreign Application Priority Data

Oct. 11, 1996 [JP] Japan ................................ 8-269647

[51] Int. Cl.⁶ ............................................. H01L 41/08
[52] U.S. Cl. .......................... 310/316; 310/317; 310/325; 318/116
[58] Field of Search ................................ 310/316, 317, 310/319, 323, 325; 318/116, 118

[56] References Cited

U.S. PATENT DOCUMENTS

| | | | |
|---|---|---|---|
| 4,952,834 | 8/1990 | Okada | 310/316 |
| 4,973,876 | 11/1990 | Roberts | 310/316 |
| 5,173,630 | 12/1992 | Tanaka | 310/316 |
| 5,198,732 | 3/1993 | Morimoto | 310/316 X |
| 5,710,491 | 1/1998 | Takagi et al. | 310/316 X |
| 5,767,609 | 6/1998 | Suganuma | 310/316 |

FOREIGN PATENT DOCUMENTS

| | | |
|---|---|---|
| 4-26933 | 3/1992 | Japan . |
| 5-330666 | 12/1993 | Japan . |
| 7-33228 | 2/1995 | Japan . |
| 9-52628 | 2/1997 | Japan . |
| 9-183508 | 7/1997 | Japan . |
| 9-183509 | 7/1997 | Japan . |

*Primary Examiner*—Mark O. Budd
*Attorney, Agent, or Firm*—Finnegan, Henderson, Farabow, Garrett & Dunner, L.L.P.

[57] ABSTRACT

Disclosed is the powder feeder in which the sampling timing G, H, ... is set during the inactive period $T_i$ in synchronism with the cycle of the duty ratio clock when the output voltage $V_{CELL}$ is fed back to the microcomputer 13, thereby the feedback signal (the output voltage $V_{CELL}$) on which noise is not superposed can be sampled and the feed amount of the powder P can be controlled with high accuracy.

23 Claims, 11 Drawing Sheets

LONGITUDINAL VIBRATION

BENDING VIBRATION

FIG.4(a)   FIG.4(b)   FIG.4(c)   FIG.4(d)

$t = 0$    $t = \frac{1}{2}\pi$    $t = \pi$    $t = \frac{3}{2}\pi$

CONTROL APPARATUS FOR INTERMITTENTLY DRIVING ACTUATOR, POWDER FEEDER AND SERVO SYSTEM UTILIZING THEREOF

BACKGROUND OF THE INVENTION

1. Field of the Invention

The present invention relates to a control apparatus for intermittently driving an actuator by applying a driving voltage based on a clock pulse while changing a duty ratio of the clock pulse by detecting change amount of an object to be controlled and feeding back it to the control apparatus, and relates to a powder feeder or servo system having the control apparatus therein.

2. Description of Related Art

It is conventionally well-known various control apparatuses which control the time average output based on the operation time per one cycle in the rectangular pulse (duty ratio). For example, it is known an ultrasonic motor utilizing an ultrasonic resonator and a servo system utilizing a DC motor. In the ultrasonic motor, it is used a piezoelectric transducer in which the mechanical deformation of a piezoelectric element caused by electric energy is used to generate mechanical vibration of a vibrator and the output of the ultrasonic motor is changed by changing the duty ratio of the driving voltage.

In case that the ultrasonic resonator in the ultrasonic motor is constructed so as to generate both axial vibration (longitudinal vibration) and bending vibration at the same time, elliptic oscillation is generated in the top end of ultrasonic resonator with the resonance frequency. A pipe is attached to the top end of the resonator, and powder is fed in the pipe, then the powder is moved in the certain direction by the elliptic oscillation, this mechanism can therefore be used in the powder feeder.

Figure 10:
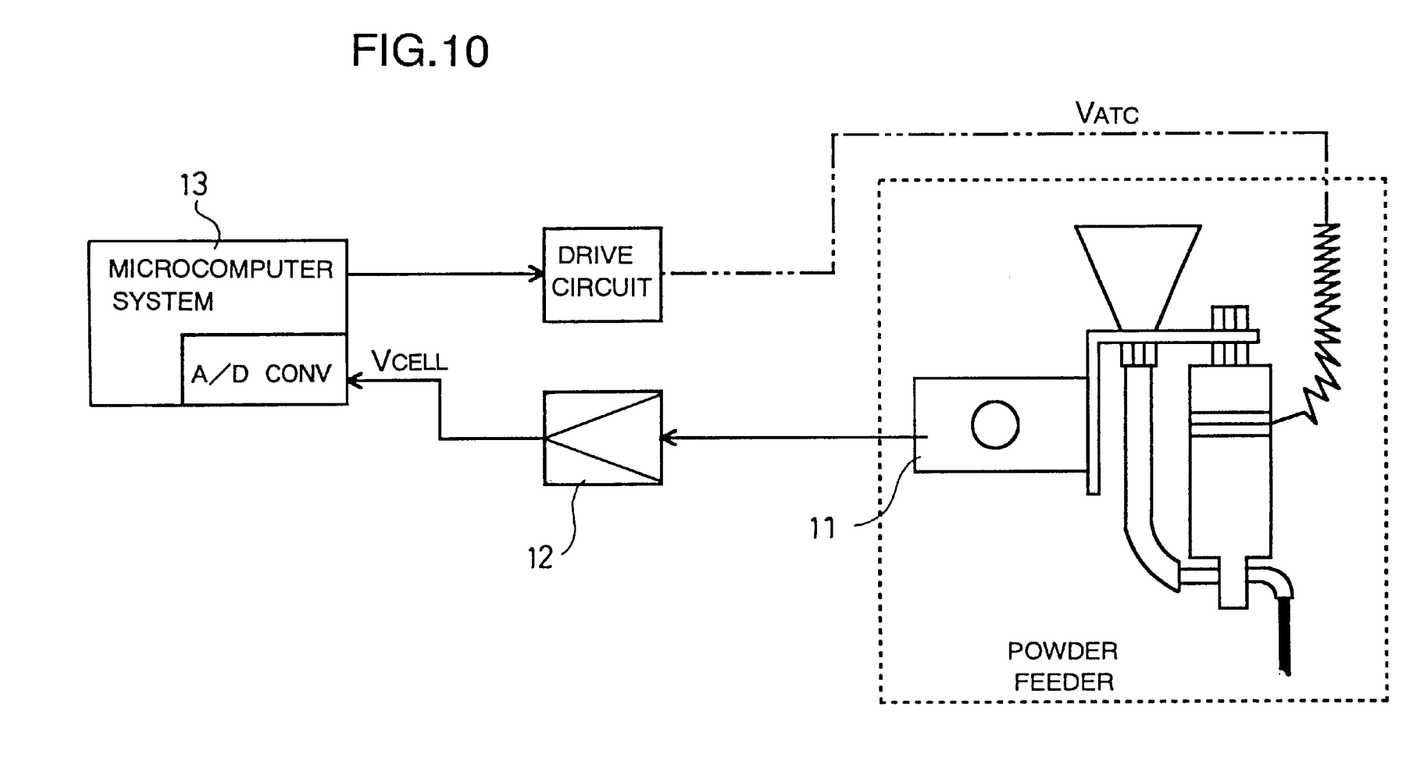
FIG. 10 is a block diagram which shows a system of the powder feeder in the prior art.

The powder feeder will be described with reference to FIG. 10. In FIG. 10, powder amount in the powder feeder is detected by a load cell 11 acting as a load sensor and the detected output (voltage) is amplified by an amplifier 12. The amplified output voltage is fed back to a microcomputer 13, which acts as duty ratio control means, through an A/D converter. In the microcomputer 13, the optimum duty ratio is calculated based on the feedback signal and the clock pulse with the optimum duty ratio is output to a drive circuit 14. The drive circuit 14 outputs the driving voltage controlled by the optimum duty ratio. Thereby, the applying time of driving voltage is controlled, and both feed amount (predetermined feed amount) and actual feed amount of the powder are controlled to a predetermined value (target value).

Figure 11:
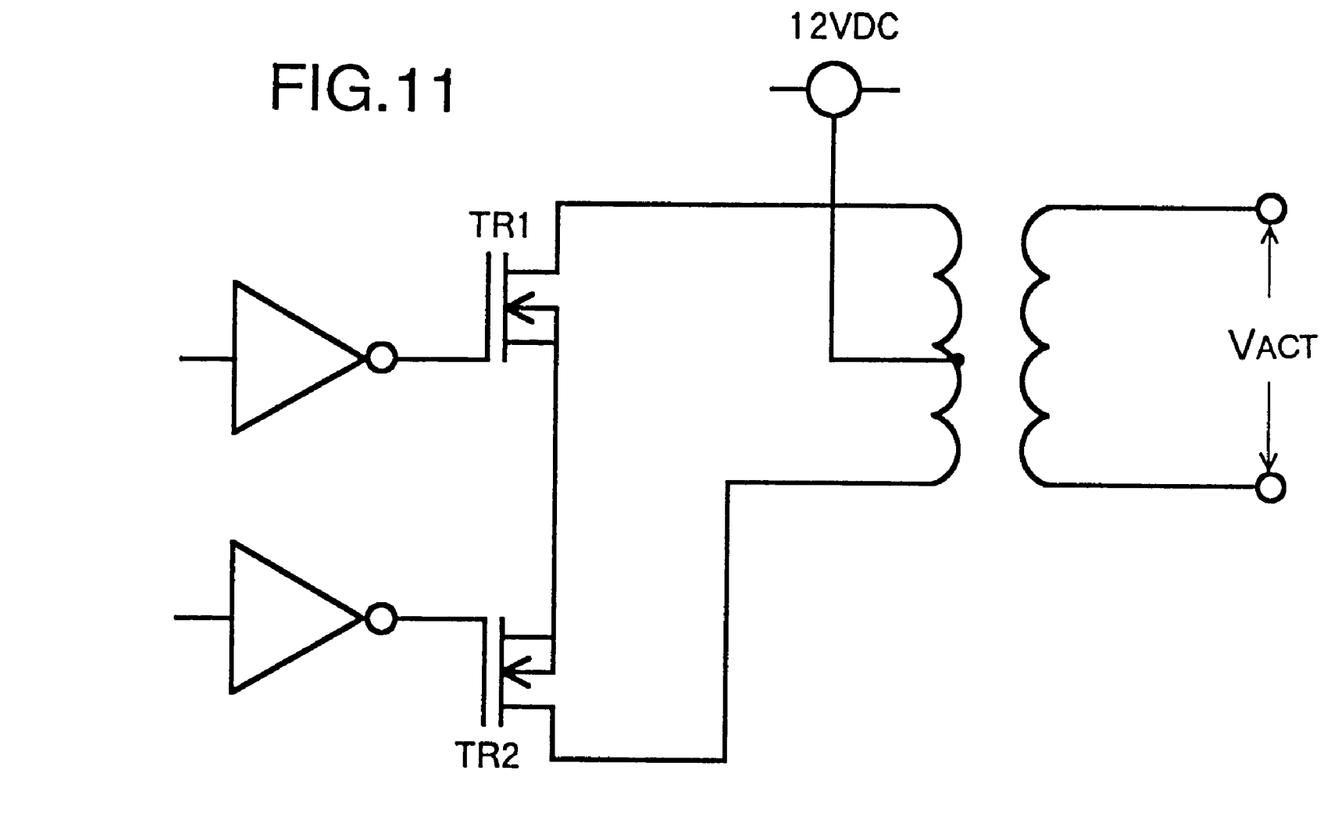
FIG. 11 is a circuit diagram of the oscillating circuit with the resonance frequency to apply the driving voltage to the vibrator.
Figure 12A:
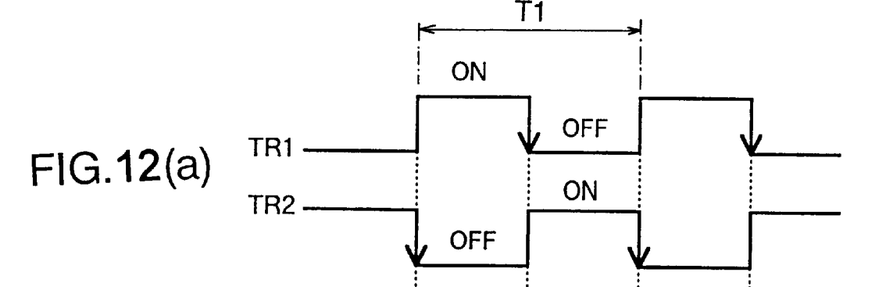
FIG. 12(a) shows the operating state of the transistors in the oscillating circuit in FIG. 11.

However, in case that, as mentioned above, the actuator such as the ultrasonic motor or DC motor is driven by using the rectangular pulse, there is a problem that spike noise is produced when the actuator is switched ON/OFF and such spike noise gives bad influence to the output voltage from the load cell 11. For instance, in the above ultrasonic motor, the driving voltage with the resonance frequency applied to the ultrasonic motor is produced by an oscillating circuit shown in FIG. 11, for an driving period (active period). In the oscillating circuit in FIG. 11, so-called push-pull circuit with transistors TR1 and TR2 exists at the primary transside. That is, as shown in FIG. 12(a), both transistors TR1, TR2 operate so that one is ON and the other is OFF or vice versa. At that time, when the transistors TR1, TR2 are switched OFF (that is, when the transistors TR1, TR2 operate so as to shut the current), high voltage is produced at the collector of the transistor TR1, TR2.

Figure 12B:
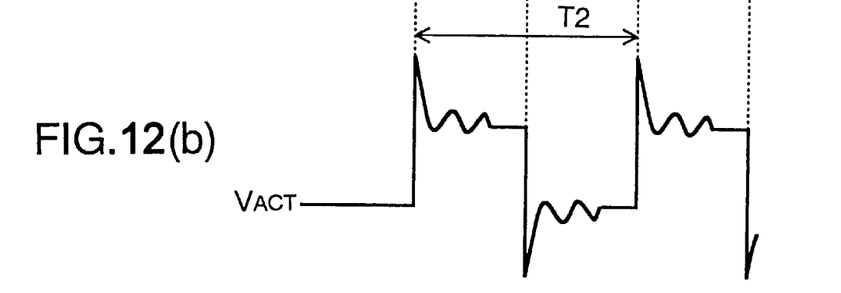
FIG. 12(b) shows the driving voltage applied to the vibrator and FIG. 12(c) shows the output voltage from the load cell.
Figure 12C:
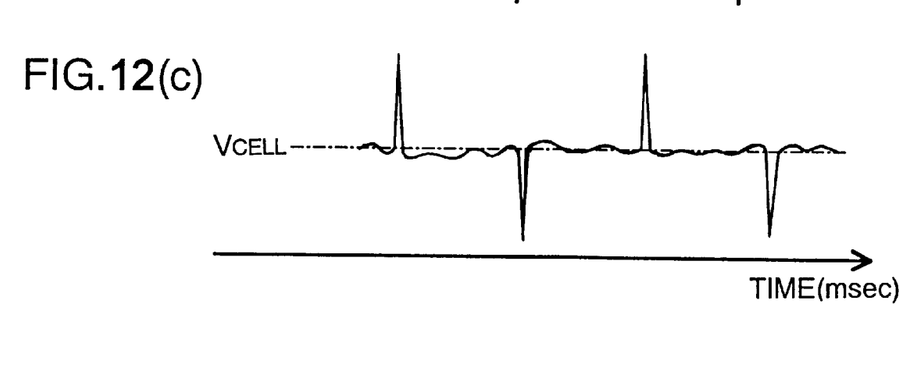

In view of the above, since noise produces when one of the transistors TR1, TR2 is switched OFF, the wave form of the driving voltage $V_{ACT}$ becomes the wave form shown in FIG. 12(b). As a result, it concludes that the noise in the driving voltage $V_{ACT}$ as disturbance is superposed on the output voltage from the load cell 11, thereby the wave form of the output voltage $V_{CELL}$ becomes the wave form shown in FIG. 12(c).

Here, as shown in FIG. 12(a), one switching cycle (ON/OFF cycle) T1 of each transistor TR1, TR2 corresponds to one cycle T2 of the driving voltage $V_{ACT}$. Therefore, if it is actually used for the powder feeder, the wave form of the driving voltage $V_{ACT}$ becomes the wave form shown in FIG. 6(b) and the wave form of the output voltage $V_{CELL}$ becomes the wave form shown in FIG. 6(c).

Figure 6A:
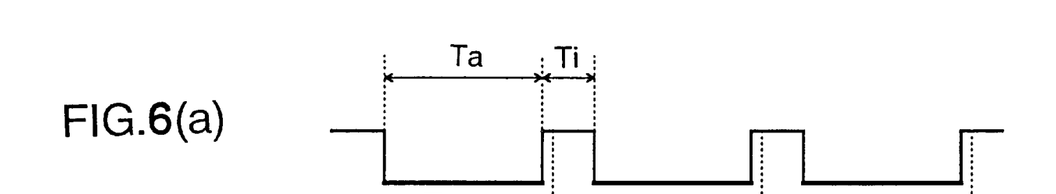
FIG. 6(a) shows the clock pulse to change the timing of an active period and an inactive period.
Figure 6B:
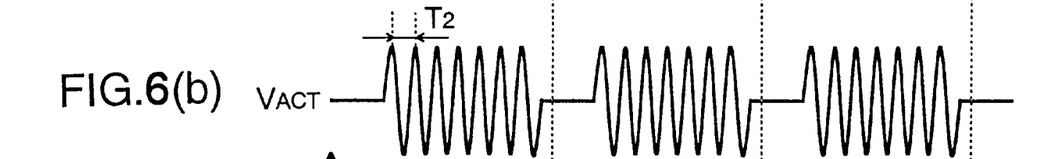
FIG. 6(b) shows the driving voltage applied to the vibrator.
Figures 6C, 6D:
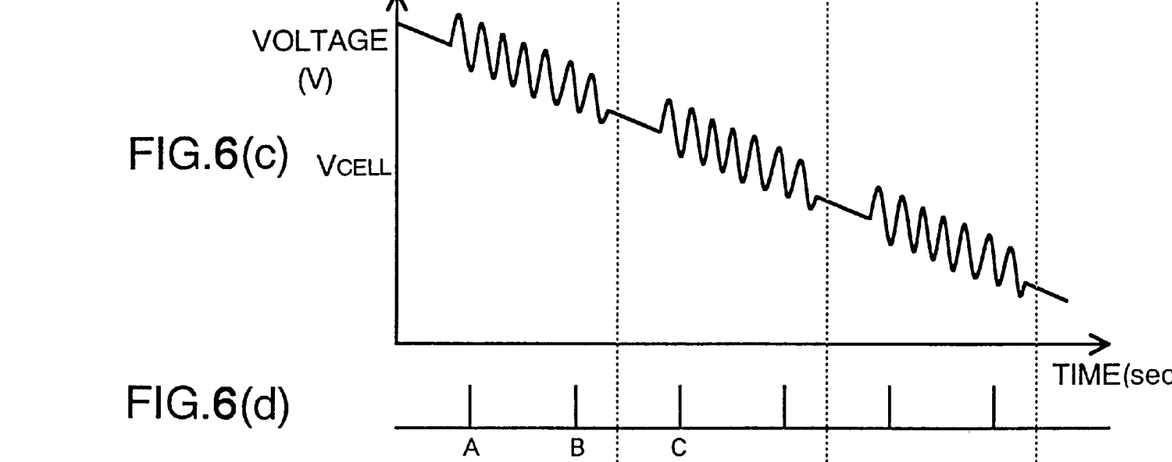
FIG. 6(c) shows the output voltage from the load cell.
FIG. 6(d) shows the sampling timing in the conventional power feeder and FIG. 6(e) shows the sampling timing in the powder feeder of the first embodiment.

Thus, if data sampling of the output voltage $V_{CELL}$ is conducted, for example, at the timing A, B, C . . . shown in FIG. 6(d) when feeding back to the microcomputer 13, the output voltage, on which the noise is superposed, is input as the feedback signal. Due to this, the actuator cannot be precisely controlled and there occurs a problem that accuracy of the control system becomes extremely bad.

SUMMARY OF THE INVENTION

Accordingly, it is an object of the present invention to overcome the above mentioned problems and to provide a control apparatus through which an actuator can be controlled with high accuracy when intermittently driving the actuator by applying a driving voltage based on a clock pulse while changing a duty ratio of the clock pulse by detecting change amount of an object to be controlled and feeding back it to the control apparatus.

Further, it is an object of the present invention to provide a powder feeder through which feed amount of the powder can be controlled with high accuracy or a servo system with a motor through which rotating speed of the motor can be controlled with high accuracy.

To accomplish the above objects, the present invention provides a control apparatus for intermittently driving an actuator by applying a driving voltage to the actuator, the control apparatus comprising:

timing clock pulse product means for producing a clock pulse with a duty ratio;

voltage application means for applying the driving voltage to the actuator according to the duty ratio;

sensor means for detecting change amount of the actuator as a voltage value;

sampling means for sampling the voltage value detected by the sensor means after a predetermined time is elapsed since the actuator stops or starts to be driven; and control means for controlling the duty ratio on the basis of voltage value sampled by the sampling means.

In the control apparatus claimed in claim 1, the intermittent driving of the actuator means that an active period during which the actuator is driven and an inactive period during which the actuator is not driven appear alternately in one cycle of the clock pulse. Thus, it is not necessary that the active period and the inactive period are repeated with the same length.

According to the control apparatus, since the voltage value detected by the sensor means is sampled by the sampling means after a predetermined time is elapsed since the actuator stops or starts to be driven, the voltage value detected by the sensor means can be sampled without being superposed with switching noise produced when the actuator is switched ON/OFF, thereby, the actuator can be controlled with high accuracy. The reason is as follows. That is, the voltage value is possibly influenced by the switching noise if the voltage value is detected just after the actuator stops or starts to be driven, therefore such influence of the switching noise can certainly be avoided by sampling the voltage value after the predetermined time is elapsed since the actuator stops or starts to be driven.

Further, the present invention provides a powder feeder for intermittently driving a vibrator having a piezoelectric element by applying a driving voltage with a predetermined resonance frequency to the piezoelectric element, the powder feeder comprising:

timing clock pulse product means for producing a clock pulse with a duty ratio;

voltage application means for applying the driving voltage to the piezoelectric element according to the duty ratio;

a powder feed pipe attached to a top end of the vibrator;

a powder storing hopper for feeding the powder to the powder feed pipe;

weight sensor means for detecting a weight of the powder in the powder storing hopper as a voltage value;

sampling means for sampling the voltage value detected by the weight sensor means after a predetermined time is elapsed since the piezoelectric element stops to be driven; and control means for controlling the duty ratio on the basis of voltage value sampled by the sampling means.

In the powder feeder claimed in claim 9, the vibrator oscillates with elliptic motion when the driving voltage is applied to the piezoelectric element, thus, the powder feed pipe attached to the top end of the vibrator oscillates with elliptic motion similarly to the vibrator. At that time, the powder fed into the powder feed pipe from the powder storing hopper receives acceleration in the horizontal direction (in the direction perpendicular to the longitudinal vibration of the vibrator and in the direction parallel to the bending vibration direction of the vibrator) and is moved. Thus, the powder is fed.

In this case, since the driving voltage is applied to the piezoelectric element while conducting ON/OFF control of the driving voltage, the powder is fed during a period that the vibrator is driven. In this way, the feed amount of the powder is controlled on the basis of proportion between the active period and inactive period, that is, the duty ratio, and after the weight of the powder in the powder storing hopper is detected by the weight sensor means as the voltage value, the detected voltage value is sampled by the sampling means so as not to be superposed with the switching noise. Thus, the feed amount of the powder can be controlled with high accuracy.

Further, the present invention provides a servo system for intermittently driving a motor by applying a driving voltage to the motor, the servo system comprising:

pulse width modulating means for producing a clock pulse with a duty ratio and for applying the driving voltage to the motor according to the duty ratio;

first sensor means for detecting a voltage in the motor as a voltage value;

second sensor means for detecting an onset edge of the clock pulse;

delay means for delaying an output signal from the second sensor means for a predetermined time;

sampling means for sampling the voltage value detected by the first sensor means on the basis of the output signal delayed by the delay means; and control means for controlling the duty ratio on the basis of voltage value sampled by the sampling means.

In the servo system claimed in claim 17, the output signal from the second sensor means is delayed for a predetermined time by the delay means and the sampling means samples the voltage value detected by the first sensor means on the basis of the output signal delayed by the delay means. Therefore, the voltage value can be also sampled without being superposed with switching noise produced when the motor is switched ON/OFF, thereby, the motor can be controlled with high accuracy. Accordingly, if the control apparatus is applied for a drive motor of a robot arm or a positioning motor to position the table of NC processing machine, the robot arm can be correctly moved or the table in the NC processing machine can be correctly positioned, with high accuracy.

The above and further objects and novel features of the invention will more fully appear from the following detailed description when the same is read in connection with the accompanying drawings. It is to be expressly understood, however, that the drawings are for purpose of illustration only and not intended as a definition of the limits of the invention.

BRIEF DESCRIPTION OF THE DRAWINGS

The invention will be described with reference to the following drawings, wherein:

FIGS. 6(a) to 6(e) is a timing chart to explain operating state of the powder feeder according to the first embodiment, wherein

FIGS. 9(a) to 9(c) is a timing chart to explain operating state of the servo system according to the second embodiment, wherein

FIGS. 12(a) to 12(c) is a timing chart to explain a noise producing theory, wherein

DETAILED DESCRIPTION OF THE PREFERRED EMBODIMENTS

Figure 1:
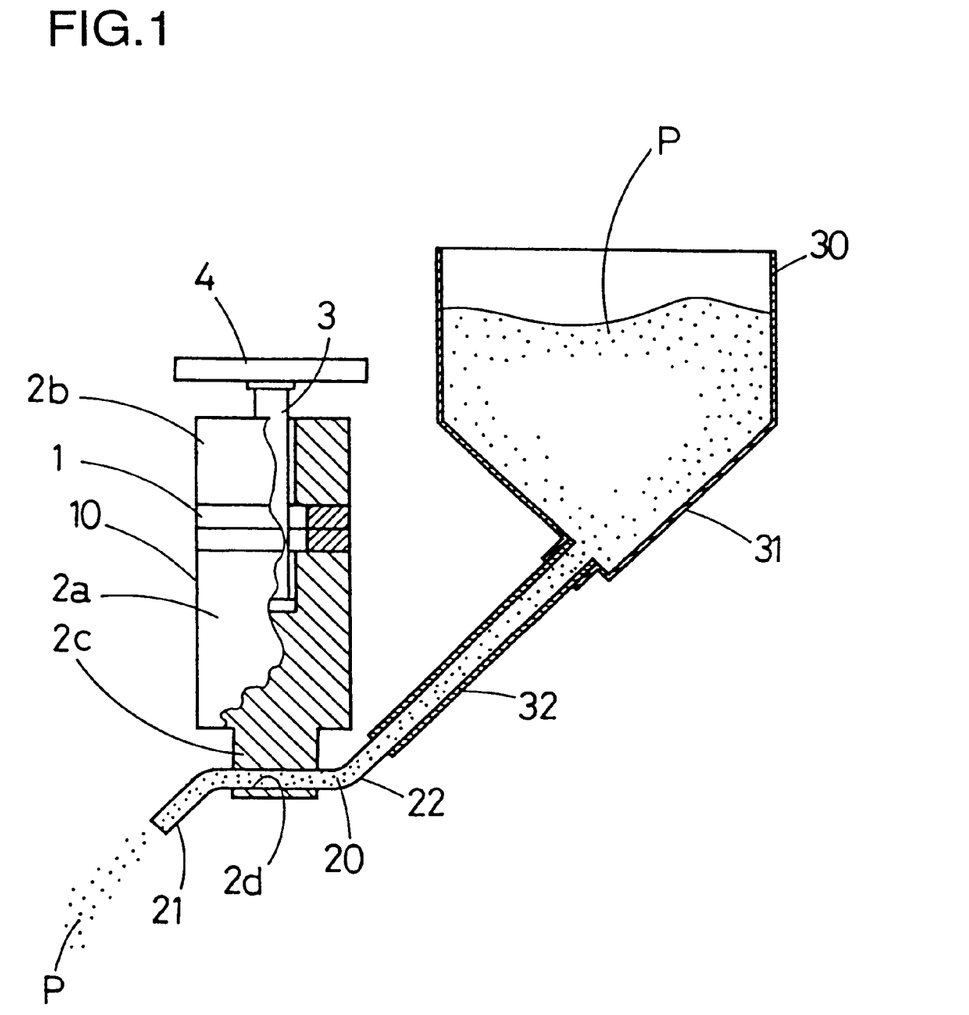
FIG. 1 is a partially sectional view which schematically shows a powder feeder according to the first embodiment of the present invention.

A detailed description of the first embodiment embodying the present invention will be given referring to the accompanying drawings. The structure of a powder feeder according to the first embodiment is shown in FIG. 1.

The vibrator 10 is a so-called linear type ultrasonic motor, two flat ring piezoelectric elements 1 are stacked with interposition of an electrode not shown in the figure, and placed between an approximately cylindrical metal horn 2a and an approximately hollow cylindrical metal back horn 2b. The vibrator 10 is fixed to a fixing member 4 with a bolt 3, which is fastened to the horn 2a at the one end, inserted through a through hole which extends through the back horn 2b and piezoelectric element 1 at the center.

The end 2c of the horn 2a is double flatted and provided with a through hole 2d for being inserted with a pipe as described hereinafter.

A powder feed pipe 20, in the inner part of which the powder circulates, is inserted and fixed to the through hole 2d. The end 21 of the powder feed pipe 20 locating in the left side of the figure is bent slightly downward to help powder P fed from the right side in the figure to drop from the end 21 of the pipe 20.

On the other hand, the other end 22 of the pipe 20 in the right side of the figure is bent slightly upward to help powder P fed from a hopper body 30 to move to the left side in the figure.

The hopper body 30 is provided for storing powder P and feeding slowly powder P to the pipe 20, the bottom 31 has a funnel configuration. A tube 32 is connected to the bottom 31, and the other end of the tube 32 is connected to the end 22 of the powder feed pipe 20. Accordingly, powder P charged in the hopper body 30 is fed to the pipe 20 through the tube 32. The tube 32 made of flexible material is selected so as not to suppress the vibration of the vibrator 10, in this embodiment a nylon tube is used.

Figure 2:
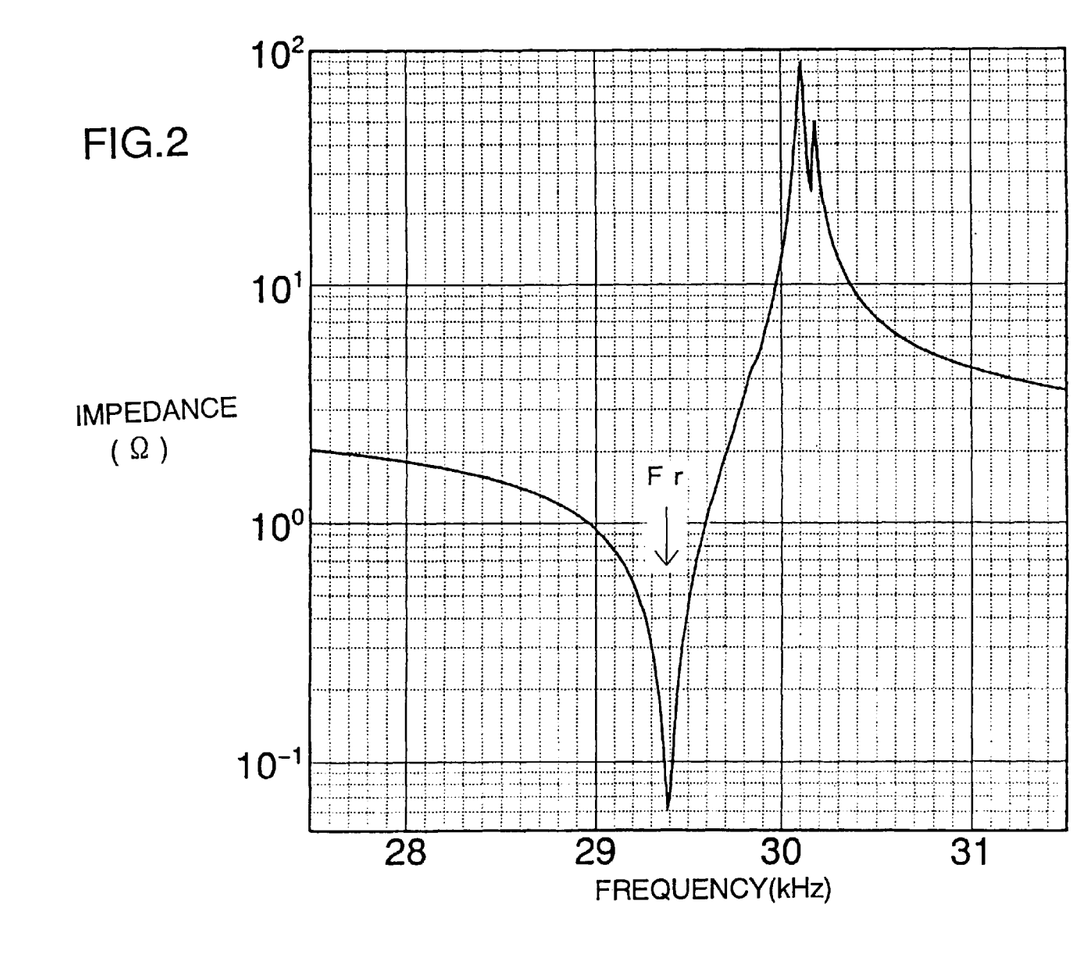
FIG. 2 is a graph which shows frequency characteristic of input impedance of a vibrator.

FIG. 2 shows the result of measurement of the input impedance frequency characteristics of the vibrator 10 measured by means of an impedance analyzer. From this result, it is obvious that the resonance frequency Fr of the vibrator 10 is about 29.4 kHz. The driving with this resonance frequency Fr generates large vibration. In the first embodiment, it is applied the alternating voltage with the resonance frequency Fr to the vibrator 10.

The vibration is described for the case that the vibrator 10 is vibrated with the resonance frequency.

Figure 3:
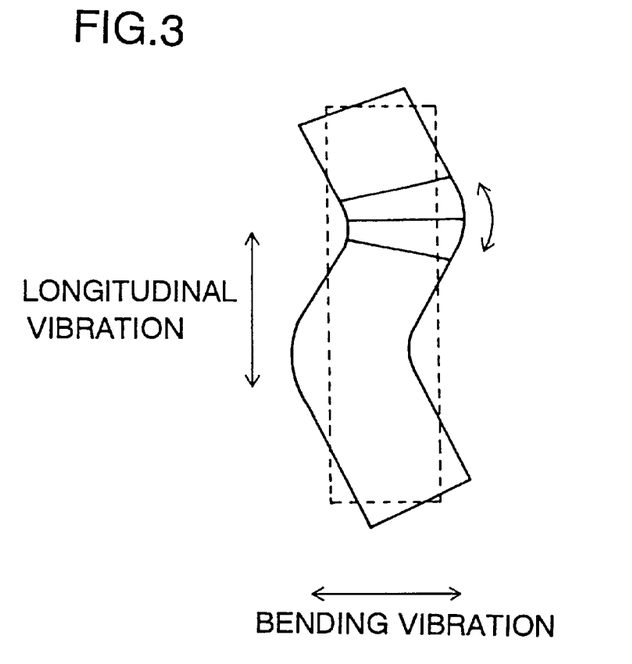
FIG. 3 is a schematic view of the vibrator which shows vibration state when driven with the resonance frequency.
Figure 4A:
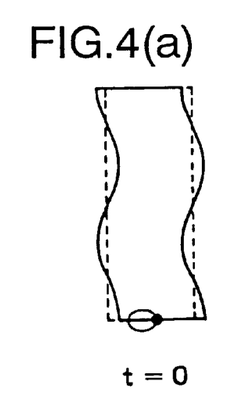
FIGS. 4(a) to 4(d) are schematic views of the vibrator which show vibration states every ¼ cycle when driven with the resonance frequency.
Figure 4B:
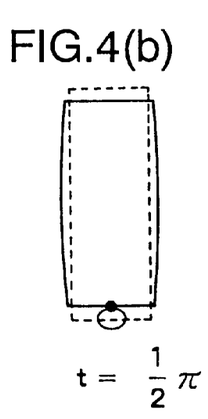
Figure 4C:
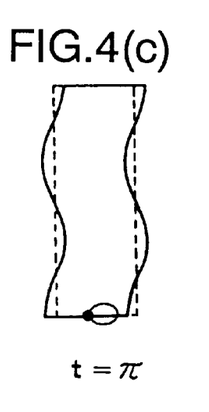
Figure 4D:
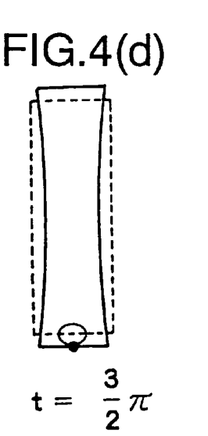

The vibration of the piezoelectric element 1 with the resonance frequency causes the extension-shrinking deformation of the piezoelectric element 1, and the vibrator 10 is bending-vibrated as shown in FIG. 3. This bending vibration is a resultant motion of the extension shrinking motion in the vertical direction in the figure (longitudinal vibration) and bending vibration in the horizontal direction in the figure (flexing vibration).

One cycle of this vibration is described in detail in FIGS. 4(a) to 4(d). For easy understanding of the motion of the end (the bottom end in the figure), the end is marked with a black dot at the center in FIGS. 4(a) to 4(d). First at t=0 (FIG. 4(a)), the end (black dot) is bent so as to deviate to the right side. Next, after ¼ cycle at t=π/2 (FIG. 4(b)), the vibrator 10 shrinks and the end (black dot) deviates to the upper side. Further, at t=π (FIG. 4(c)), the end (black dot) is bent so as to deviate to the left side. After the additional ¼ cycle at t=3π/2 (FIG. 4(d)), the vibrator 10 is extended, and the end (black dot) deviates to the lower side in the figure. Accordingly, the tracing of the black dot for one cycle shows an elliptic motion as shown in FIGS. 4(a) to 4(d).

Therefore, a pipe is attached to this end and powder is fed in the pipe, then the powder is accelerated in the left direction with floating motion, and moved to the left side.

Figure 5:
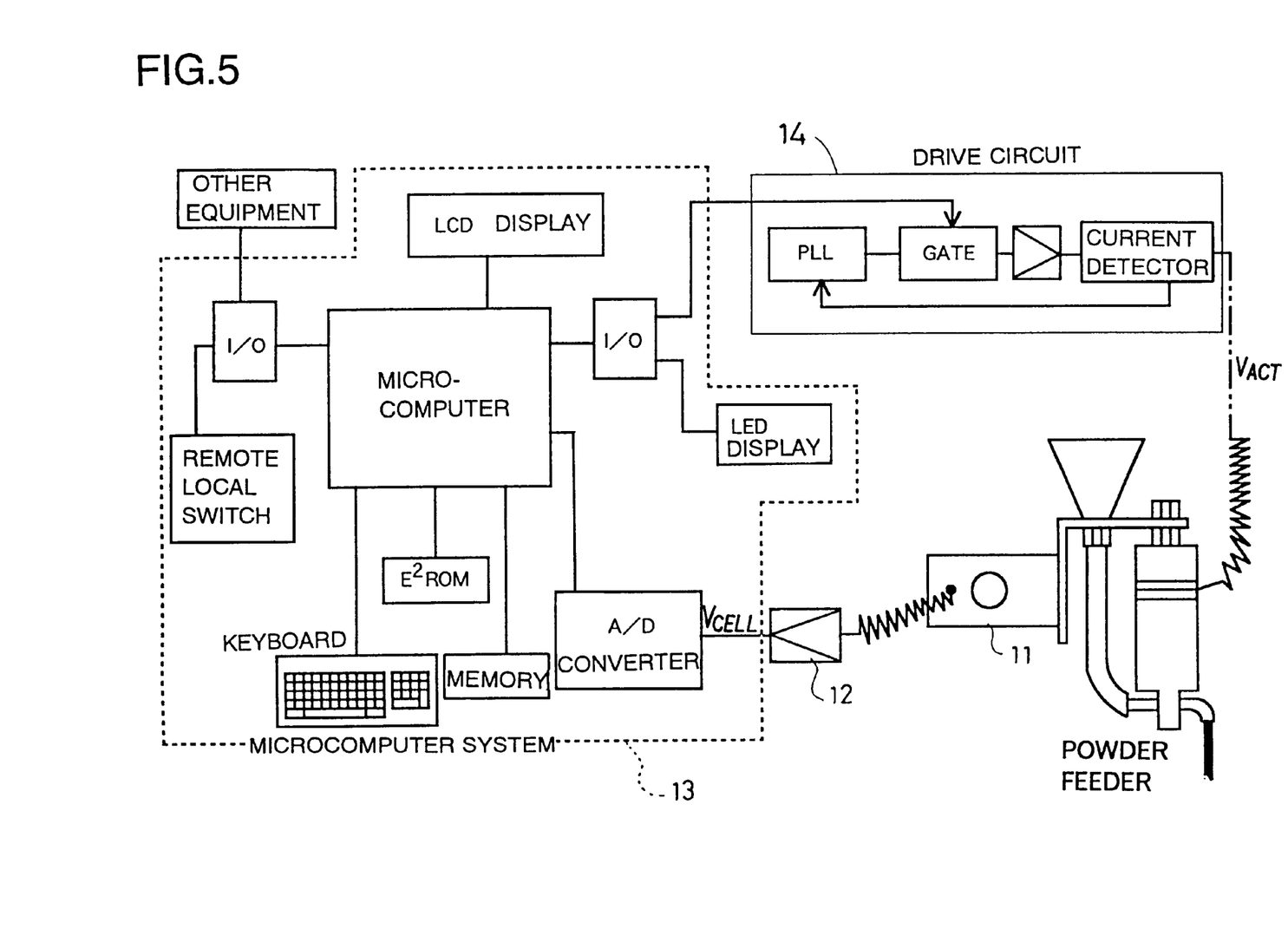
FIG. 5 is a block diagram which shows a system of the powder feeder according to the first embodiment.

Further, the feed amount (predetermined feed amount) of the powder P is adjusted by changing the period to drive the vibrator 10 with the resonance frequency Fr, that is, the duty ratio. At this time, weight of the powder P in the hopper body 30 is detected by the load cell 11, and the output signal from the load cell 11 is fed back to the microcomputer 13. On the basis of the feedback signal the microcomputer 13 calculates the control signal to optimize the duty ratio and the control signal is output to the drive circuit 14. The drive circuit 14 applies the driving voltage $V_{ACT}$ to the vibrator 10 for the time corresponding to the duty ratio, thereby the feed amount and the actual feed amount of the powder P is controlled. In the first embodiment, the microcomputer 13 is used for the duty ratio control means.

In the conventional control apparatus, the output voltage $V_{CELL}$ which is the feedback signal from the load cell 11 is sampled to the microcomputer 13, regardless of whether the output voltage is sampled during the active period $T_a$ or the inactive period $T_i$. Therefore, if the output voltage $V_{CELL}$ from the load cell 11 is, for example, sampled at the timing A, B, C . . . as shown in FIG. 6(d), that is, during the active period $T_a$ of the duty ratio control signal, the duty ratio is calculated on the basis of the output voltage $V_{CELL}$ on which the noise is superposed. As a result, the feed amount of the powder P cannot be controlled to the predetermined feed amount and actual feed amount.

In the first embodiment, the output voltage $V_{CELL}$ from the load cell 11 is sampled synchronously with the inactive period $T_i$ in the duty ratio control signal. Synchronization of the sampling timing is conducted by the program executed in the microcomputer 13.

Control method of the powder feeder will be described with reference to FIG. 6. FIG. 6(a) shows a timing clock (duty ratio clock) for intermittently driving the vibrator 10. This clock signal is prepared by the microcomputer 13 as the duty ratio control means. In FIG. 6(a), the active period $T_a$ is represented with "Low" and the inactive period $T_i$ is represented with "High". The duty ratio is represented by proportion of the active period $T_a$ in one cycle and is calculated by $T_a/(T_a+T_i)$.

FIG. 6(b) shows changing state of the driving voltage $V_{ACT}$ which is applied to the piezoelectric element 1. In FIG. 6(b), it is understandable that amplitude of the voltage $V_{ACT}$ does not change, the alternating voltage with the resonance frequency Fr is applied during the active period $T_a$ and is not applied during the inactive period $T_i$.

When the voltage $V_{ACT}$ shown in FIG. 6(b) is applied to the piezoelectric element 1, the vibrator 10 is oscillated. In this case, the driving with the resonance frequency Fr causes the resonance of the vibrator 10 to vibrate with large amplitude, and the end thereof is brought into elliptic motion. On the other hand, if the driving voltage is not applied to the piezoelectric element 1 the vibrator does not vibrate.

FIG. 6(c) shows the change of the output voltage $V_{CELL}$ from the load cell 11. The amplitude of the output voltage $V_{CELL}$ gradually becomes small since the amount of the powder P in the hopper body 30 decreases according to time passage. Switching noise mentioned above is superposed during the active period $T_a$.

Figure 6E:
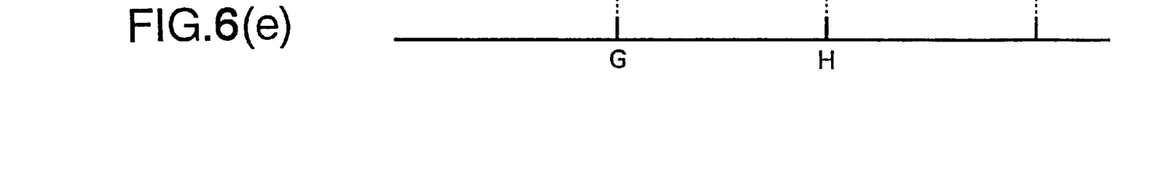

FIG. 6(e) shows the sampling timing to sample the feedback signal, that is, the output voltage value $V_{CELL}$ into the A/D converter. In FIG. 6(e), the sampling timing G, H, . . . is set in the inactive period $T_i$, synchronously with the duty ratio clock. In detail, the sampling of the output voltage $V_{CELL}$ is conducted after several msec is lapsed from the just start time of the inactive period $T_i$. The reason is as follows. That is, if the output voltage $V_{CELL}$ is sampled just after the start time of the inactive period $T_i$, the voltage $V_{CELL}$ is possibly influenced by the switching noise, therefore it is necessary to avoid the influence of the switching noise. Thus, if the output voltage $V_{CELL}$ is sampled at the timing G, H . . . , it can certainly feed back the output voltage $V_{CELL}$ on which the switching noise is not superposed.

Figure 7A:
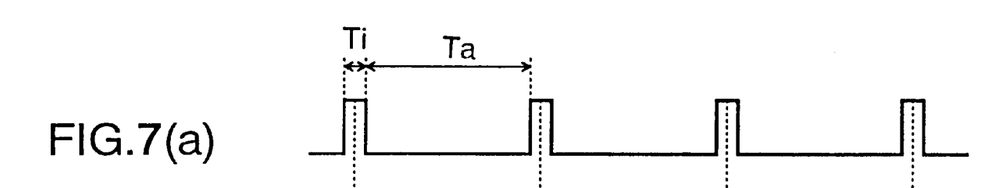
FIGS. 7(a) to 7(c) and 7(e) is a timing chart to explain operating state of the powder feeder according to the first embodiment, when using the clock pulse with the maximum duty ratio, wherein FIGS. 7(a)–7(c) and 7(e) corresponds to FIGS. 6(a)–6(c) and 6(e), respectively.
Figures 7B, 7C:
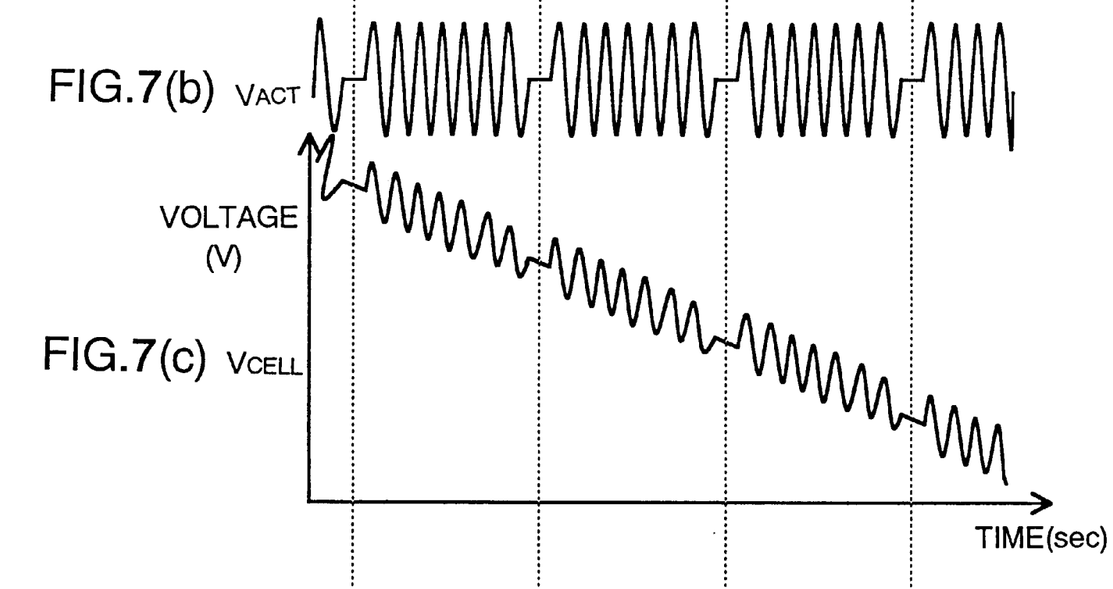
Figure 7E:
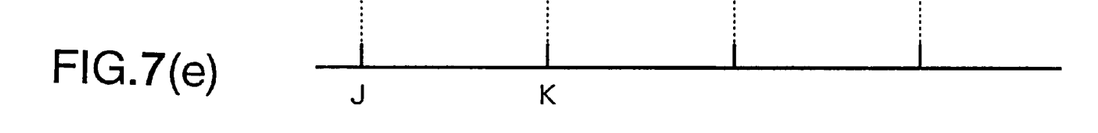

However, if the duty ratio is 100%, that is, the piezoelectric is continuously driven, there does not exist the inactive period $T_i$ during which the vibration of the vibrator 10 stops. In this case, it cannot feed back to the microcomputer 13 the output voltage $V_{CELL}$ on which the switching noise is not superposed. Taking the above into consideration, the maximum value of the duty ratio is set to 95% as shown in FIG. 7 in the first embodiment. According to this, the inactive period $T_i$ is secured and the sampling timing J, K, . . . is set in synchronism with the inactive period $T_i$. Therefore, it can certainly feed back the output voltage $V_{CELL}$ on which the switching noise is not superposed.

As mentioned above, according to the powder feeder of the first embodiment, the sampling timing G, H, . . . or J, K, . . . of the output voltage $V_{CELL}$ from the load cell 11 are set so as to synchronize with the cycle of the inactive period $T_i$. Therefore, the output voltage $V_{CELL}$ on which the switching noise is not superposed can be certainly fed back to the microcomputer 13. Further, since the microcomputer 13 can calculate the optimum duty ratio based on the correct feedback signal, the feed amount of the powder P can be controlled with high accuracy.

Figure 8:
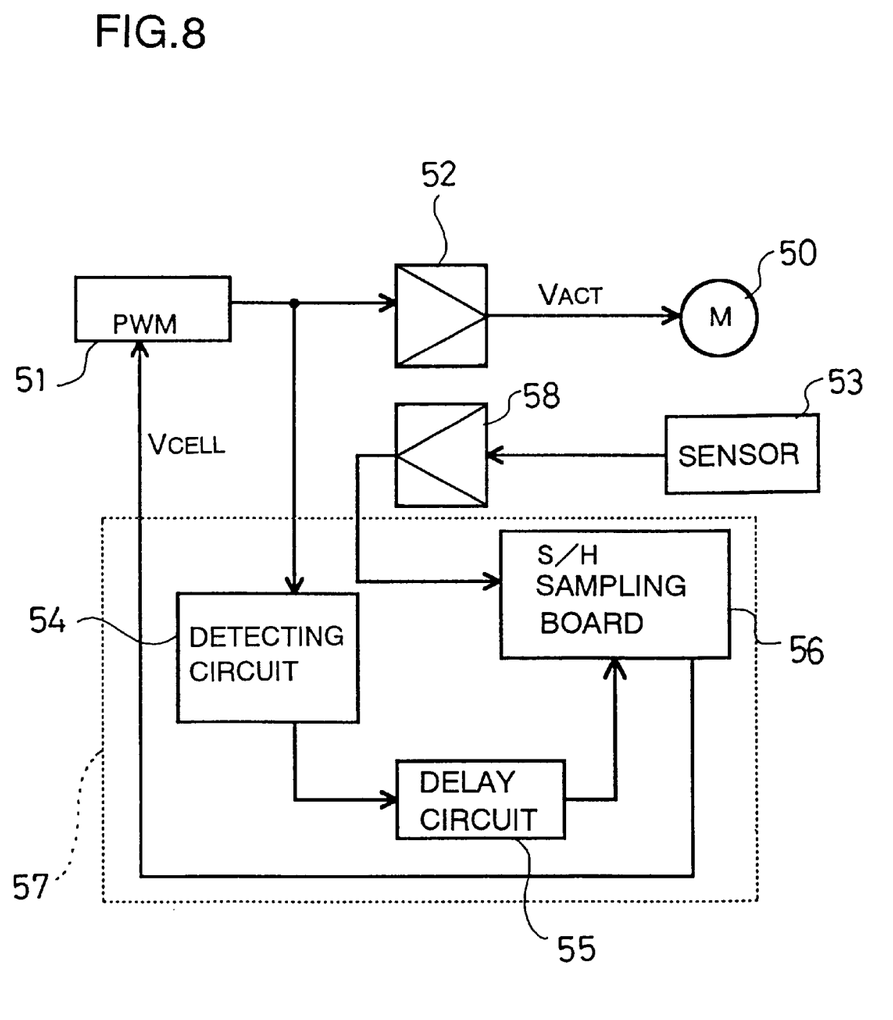
FIG. 8 is a block diagram which shows the servo system according to the second embodiment.

The servo system of a DC motor according to the second embodiment will be described with reference to FIG. 8. In the second embodiment, the DC motor 50 is used as the actuator and the sensor 53 detects the voltage value of the DC motor 50. The detected voltage value is amplified by the amplifier 58 and the amplified voltage value is fed back to the sampling board 56, thereby the rotating speed of the DC motor 53 is controlled. Further, PWM (Pulse Width Modulation) control device 51 is utilized and the PWM signal from the control device 51 is amplified by the amplifier 52. The DC motor 50 is driven by the amplified signal from the amplifier 52.

Figure 9A:
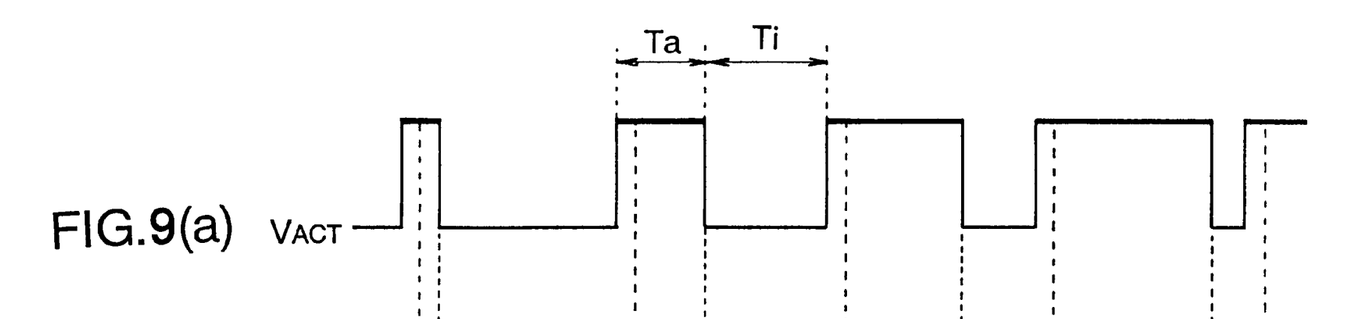
FIG. 9(a) shows the clock pulse (PWM signal) to change the timing of an active period and an inactive period.

Control method in the servo system of the second embodiment will be described with reference to FIG. 9. FIG. 9(a) shows a PWM wave form which is the timing clock to intermittently drive the DC motor 50. In FIG. 9(a), the active period $T_a$ is represented with "High" and the inactive period $T_i$ is represented with "Low". Since PWM wave corresponds to the change of driving voltage for the DC motor 50, the DC motor 50 is driven during the active period $T_a$ and is not driven during the inactive period $T_i$.

Figures 9B, 9C:
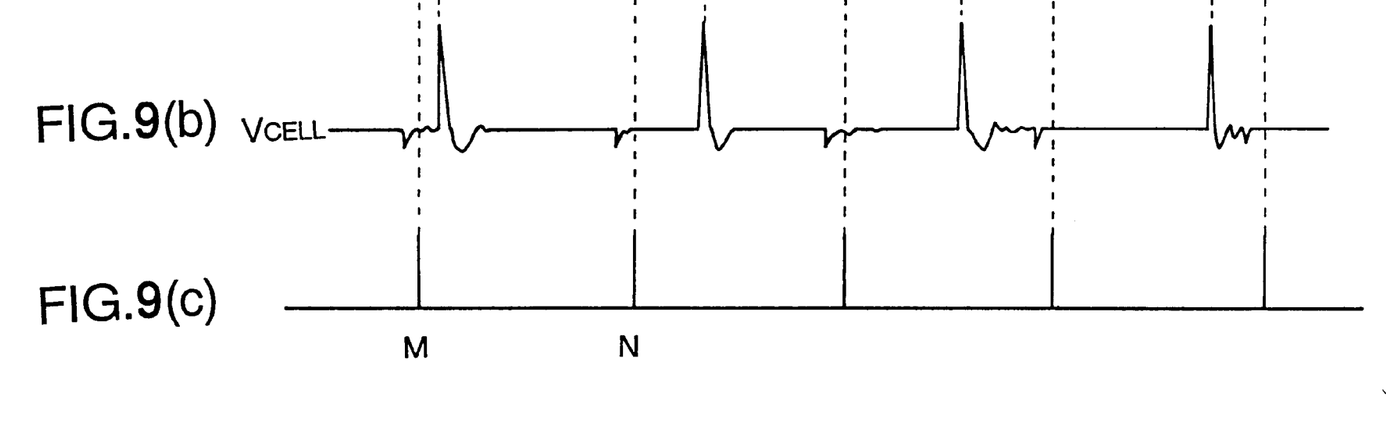
FIG. 9(b) shows the output voltage from a sensor.
FIG. 9(c) shows the sampling timing in the servo system of the second embodiment.

FIG. 9(b) shows the change of the output voltage from the sensor 53. In case that the DC motor 53 is switched ON/OFF, a large induced electromotive force is produced due to the inductance included in the DC motor 50 when the DC motor 50 is switched OFF. At that time, noise is produced and such noise as disturbance is superposed on the output voltage from the sensor 53. It is understandable that the noise is superposed, as shown in the wave form of the $V_{CELL}$ in FIG. 9(b), on the output voltage when the DC motor 50 is switched OFF at the initial of the inactive period $T_i$.

FIG. 9(c) shows the sampling timing at which the feedback signal, that is, the output voltage is sampled. The sampling timing M, N, . . . is set within the active period $T_a$, in synchronism with the duty ratio. The sampling timing M, N, . . . is set so that data sampling is conducted after the optimum delay time is lapsed since the DC motor 50 starts to be driven, by the electronic circuit 57 including the detecting circuit 54 which detects the onset edge of the PWM wave form shown in FIG. 8, the delay circuit 55 and the sampling board 56.

Thus, as same in the first embodiment, the output voltage $V_{CELL}$ on which the noise is not superposed can be fed back, thereby the rotating speed of the DC motor 50 can be controlled with high accuracy.

As mentioned above, according to the second embodiment, the sampling timing M, N, . . . of the output voltage detected by the sensor 53 is set so as to synchronize with the cycle of the active period $T_a$. Therefore, the output voltage $V_{CELL}$ on which the noise is not superposed can be fed back and the rotating speed of the DC motor 50 can be controlled with high accuracy.

Further, it is not used the microcomputer in the second embodiment, instead the sampling timing M, N, . . . of the output voltage $V_{CELL}$ by the electronic circuit 57 which is easily constructed. Thus, the control apparatus of the second embodiment can be realized with low cost.

While the invention has been particularly shown and described with reference to preferred embodiments thereof, it will be understood by those skilled in the art that the foregoing and other changes in form and details can be made therein without departing from the spirit and scope of the invention. For instance, though the powder feeder in which the ultrasonic motor using the piezoelectric element as driving source and the servo system using the DC motor are described, the present invention can be applied for the apparatus which controls the actuator so as to be intermittently driven. For example, the present invention can be utilized for output controlling of the ultrasonic processing machine such as the ultrasonic welder used for welding or processing of plastics.

What is claimed is:

1. A control apparatus for intermittently driving an actuator by applying a driving voltage to the actuator, the control apparatus comprising:

timing clock pulse product means for producing a clock pulse with a duty ratio;

voltage application means for applying the driving voltage to the actuator according to the duty ratio;

sensor means for detecting change amount of the actuator as a voltage value;

sampling means for sampling the voltage value detected by the sensor means after a predetermined time is elapsed since the actuator stops or starts to be driven; and control means for controlling the duty ratio on the basis of voltage value sampled by the sampling means.

2. The control apparatus according to claim 1, wherein the clock pulse has an active period and an inactive period in one cycle of the clock pulse and the duty ratio is determined by proportion of the active period in one cycle of the clock pulse.

3. The control apparatus according to claim 2, wherein the maximum value of the duty ratio is set to 95%.

4. The control apparatus according to claim 2, wherein the driving voltage is applied to the actuator during the active period.

5. The control apparatus according to claim 1, wherein the driving voltage is a voltage with a resonance frequency of the actuator.

6. The control apparatus according to claim 1, wherein the predetermined time is set to several msec.

7. The control apparatus according to claim 1, wherein the actuator comprises an ultrasonic motor.

8. The control apparatus according to claim 1, wherein the actuator comprises a DC motor.

9. A powder feeder for intermittently driving a vibrator having a piezoelectric element by applying a driving voltage with a predetermined resonance frequency to the piezoelectric element, the powder feeder comprising:

timing clock pulse product means for producing a clock pulse with a duty ratio;

voltage application means for applying the driving voltage to the piezoelectric element according to the duty ratio;

a powder feed pipe attached to a top end of the vibrator;

a powder storing hopper for feeding the powder to the powder feed pipe;

weight sensor means for detecting a weight of the powder in the powder storing hopper as a voltage value;

sampling means for sampling the voltage value detected by the weight sensor means after a predetermined time is elapsed since the piezoelectric element stops to be driven; and control means for controlling the duty ratio on the basis of voltage value sampled by the sampling means.

10. The powder feeder according to claim 9, wherein the vibrator comprises an ultrasonic motor.

11. The powder feeder according to claim 9, wherein the powder feed pipe is formed of nylon tube.

12. The powder feeder according to claim 10, wherein the resonance frequency is approximately 29.4 kHz.

13. The powder feeder according to claim 9, wherein the weight sensor means comprises a load cell.

14. The powder feeder according to claim 9, wherein the clock pulse has an active period and an inactive period in one cycle of the clock pulse and the duty ratio is determined by proportion of the active period in one cycle of the clock pulse.

15. The powder feeder according to claim 14, wherein the maximum value of the duty ratio is set to 95%.

16. The powder feeder according to claim 14, wherein the driving voltage is applied to the piezoelectric element during the active period.

17. The powder feeder according to claim 9, wherein the predetermined time is set to several msec.

18. A servo system for intermittently driving a motor by applying a driving voltage to the motor, the servo system comprising:

pulse width modulating means for producing a clock pulse with a duty ratio and for applying the driving voltage to the motor according to the duty ratio;

first sensor means for detecting a voltage in the motor as a voltage value;

second sensor means for detecting an onset edge of the clock pulse;

delay means for delaying an output signal from the second sensor means for a predetermined time;

sampling means for sampling the voltage value detected by the first sensor means on the basis of the output signal delayed by the delay means; and control means for controlling the duty ratio on the basis of voltage value sampled by the sampling means.

19. The servo system according to claim 18, wherein the clock pulse has an active period and an inactive period in one cycle of the clock pulse and the duty ratio is determined by proportion of the active period in one cycle of the clock pulse.

20. The servo system according to claim 19, wherein the driving voltage is applied to the motor during the active period.

21. The servo system according to claim 18, wherein the driving voltage is a voltage with a resonance frequency of the actuator.

22. The servo system according to claim 18, wherein the predetermined time is set to several msec.

23. The servo system according to claim 18, wherein the motor comprises a DC motor.

* * * * *